US009497852B2

(12) United States Patent
Nakabayashi et al.

(10) Patent No.: US 9,497,852 B2
(45) Date of Patent: Nov. 15, 2016

(54) HIGH-FREQUENCY CIRCUIT SUBSTRATE

(75) Inventors: Makoto Nakabayashi, Sennan-gun (JP); Kazuaki Ikeda, Sennan-gun (JP)

(73) Assignee: SUMITOMO ELECTRIC FINE POLYMER, INC., Sennan-gun, Osaka (JP)

(*) Notice: Subject to any disclaimer, the term of this patent is extended or adjusted under 35 U.S.C. 154(b) by 0 days.

(21) Appl. No.: 13/879,690

(22) PCT Filed: May 21, 2012

(86) PCT No.: PCT/JP2012/062937
§ 371 (c)(1),
(2), (4) Date: Apr. 16, 2013

(87) PCT Pub. No.: WO2012/161162
PCT Pub. Date: Nov. 29, 2012

(65) Prior Publication Data
US 2013/0199828 A1 Aug. 8, 2013

(30) Foreign Application Priority Data
May 23, 2011 (JP) ................. 2011-114882

(51) Int. Cl.
*B32B 3/00* (2006.01)
*H05K 1/02* (2006.01)
(Continued)

(52) U.S. Cl.
CPC ............... *H05K 1/024* (2013.01); *H05K 3/38* (2013.01); *H05K 1/034* (2013.01); *H05K 2201/015* (2013.01); *H05K 2203/092* (2013.01)

(58) Field of Classification Search
CPC ............... H05K 2201/0355; C08J 5/24; B23B 27/00; B23B 27/08
(Continued)

(56) References Cited

U.S. PATENT DOCUMENTS 4,640,866 A * 2/1987 Suzuki ................... 428/422
4,680,220 A * 7/1987 Johnson ................ 442/232
(Continued)

FOREIGN PATENT DOCUMENTS

JP 3-207473 A 9/1991
JP H0569442 * 3/1993
(Continued)

OTHER PUBLICATIONS

Tang, Xiaodong, et al., "The Synthesis of Low Dielectric Loss Crosslinked Polystryene", Chinese Master's Theses Full-text Database, published May 31, 2008.

*Primary Examiner* — Daniel J Schleis
(74) *Attorney, Agent, or Firm* — Drinker Biddle & Reath LLP

(57) ABSTRACT

The invention offers a high-frequency circuit substrate that sufficiently decreases the transmission delay and transFmission loss in comparison with the conventional high-frequency circuit substrate. In the offered high-frequency circuit substrate, a dielectric layer made of fluororesin is brought into intimate contact directly with a metal conductor that is used for wiring and that has a surface not subjected to coarsening treatment or primer treatment. The offered high-frequency circuit substrate causes a transmission loss of −3 dB/m or less at a frequency of 1 GHz and has a combined specific inductive capacity of 2.6 or less and a combined dielectric loss tangent of 0.0007 or less.

12 Claims, 2 Drawing Sheets

(51) Int. Cl.
*H05K 3/38* (2006.01)
*H05K 1/03* (2006.01)

(58) Field of Classification Search
USPC .................. 428/209, 297.4, 320.2, 421
See application file for complete search history.

(56) References Cited

U.S. PATENT DOCUMENTS

| | | | | |
|---|---|---|---|---|
| 4,818,618 | A * | 4/1989 | Okazaki | B05D 5/083 428/421 |
| 4,886,699 | A * | 12/1989 | Carroll et al. | 442/235 |
| 4,895,752 | A * | 1/1990 | McEwen | 442/233 |
| 5,055,342 | A * | 10/1991 | Markovich et al. | 428/137 |
| 5,444,103 | A * | 8/1995 | Tabata | C08J 3/28 522/156 |
| 5,552,210 | A * | 9/1996 | Horn et al. | 428/209 |
| 6,417,459 | B1 * | 7/2002 | Kanzaki et al. | 174/254 |
| 6,552,099 | B2 * | 4/2003 | Yamamoto | C08J 3/28 522/150 |
| 7,439,200 | B2 * | 10/2008 | Lee et al. | 442/232 |
| 2008/0107866 | A1 * | 5/2008 | Iwasa | B32B 15/08 428/141 |

FOREIGN PATENT DOCUMENTS

| | | | |
|---|---|---|---|
| JP | 6-126907 | A | 5/1994 |
| JP | H06344503 | * | 12/1994 |
| JP | 2000-326441 | A | 11/2000 |
| JP | 2001-007466 | A | 1/2001 |
| JP | 2001-224928 | A | 8/2001 |
| JP | 2002-225204 | A | 8/2002 |
| JP | 2003-211616 | A | 7/2003 |
| JP | 2003-249733 | A | 9/2003 |
| JP | 2004-083704 | A | 3/2004 |
| JP | 2004-243605 | A | 9/2004 |
| JP | 2007-314720 | A | 12/2007 |
| JP | 2008-109331 | A | 5/2008 |
| JP | 2008-186680 | A | 8/2008 |
| JP | 2009-007551 | A | 1/2009 |
| JP | 2009-119855 | A | 6/2009 |
| JP | 4296250 | B2 | 7/2009 |
| JP | 2009-193732 | A | 8/2009 |
| WO | WO-01/97234 | A1 | 12/2001 |
| WO | WO-2006/062138 | A1 | 6/2006 |

* cited by examiner

HIGH-FREQUENCY CIRCUIT SUBSTRATE

TECHNICAL FIELD

The present invention relates to a high-frequency circuit substrate to be used in a high-frequency communications device.

BACKGROUND ART

In recent years, the amount of information communication has been steadily increasing. In response to this trend, for example, for devices such as IC cards and mobile telephones, communication at regions of higher frequencies, such as a microwave and a millimeter wave, has become active. For this reason, the market has been requiring a high-frequency circuit substrate that can be used in a high-frequency region and that further decreases the transmission delay and transmission loss.

The transmission velocity V, which relates to the transmission delay, and the transmission loss $\alpha d$ can be expressed by Formulae 1 and 2, respectively, shown below by using the specific inductive capacity $\epsilon r$ and dielectric loss tangent $\tan \delta$ of the substrate material.

$$V \propto 1/\sqrt{\epsilon r} \qquad \text{Formula 1}$$

$$\Delta d \propto f \times \sqrt{\epsilon r} \times \tan \delta \qquad \text{Formula 2,}$$

where f denotes frequency.

Formula 1 shows that it is desirable to use a material having a low specific inductive capacity $\epsilon r$ to decrease the transmission delay, that is, to increase the transmission velocity V. Formula 2 shows that it is desirable that the specific inductive capacity $\epsilon r$ and the dielectric loss tangent $\tan \delta$ be low to decrease the transmission loss $\alpha d$.

The types of material having a low specific inductive capacity and a low dielectric loss tangent, described above, include fluororesins such as polytetrafluoroethylene (PTFE), a tetrafluoroethylene-perfluoroalkylvinyl ether copolymer (PFA), a tetrafluoroethylene-hexafluoropropylene copolymer (FEP), an ethylene-tetrafluoroethylene copolymer (ETFE), and polyvinylidene fluoride (PVdF). Researchers and engineers have developed high-frequency circuit substrates in which a dielectric layer made of fluororesin is formed on a metal base material (conductor) (for example, Patent Literatures 1 and 2).

CITATION LIST

Patent Literature

Patent Literature 1: the published Japanese patent application Tokukai 2001-7466
Patent Literature 2: the published Japanese patent 4296250

SUMMARY OF INVENTION

Technical Problem

Despite the above description, the conventionally offered high-frequency circuit substrate incorporating fluororesin has remained to have a combined specific inductive capacity of 2.6 and a combined dielectric loss tangent of 0.0007 and to cause a transmission loss of −4 dB/m or so all at a frequency of 1 GHz. In the above description, the transmission loss is defined as a transmission loss converted to the transmission characteristic when measured by using the strip line configuration, shown in FIG. 4, having a length of 1 m, an impedance of 50Ω, a copper-foil thickness of 35 microns, and a ground-to-ground distance of 0.28 mm. The same definition also applies to the following cases. As described above, it cannot be said that the conventional high-frequency circuit substrate has sufficiently decreased the transmission delay and transmission loss to respond to the earlier-described market requirement in recent years.

In light of the above-described problem, an object of the present invention is to offer a high-frequency circuit substrate that sufficiently decreases the transmission delay and transmission loss in comparison with the conventional high-frequency circuit substrate.

Solution to Problem

To solve the above-described problem, the present inventors initially made a close study of the problem with the conventional high-frequency circuit substrate incorporating fluororesin.

As described above, fluororesin such as polytetrafluoroethylene (PTFE) is a material having a low specific inductive capacity and a low dielectric loss tangent and consequently is desirable as the dielectric layer of a high-frequency circuit substrate.

Nevertheless, the fluororesin has a considerably low surface energy and is non-adhesive. As a result, intimate contact with the metal conductor (metal base material) cannot be secured sufficiently, so that sufficient peel strength cannot be achieved. If the peel strength is insufficient, when a circuit is formed by etching the metal base material, the dielectric layer and the metal base material may be delaminated, so that the etching liquid may enter the gap. In particular, in the case of an FPC (flexible circuit substrate), the delamination sometimes occurs during use. In other words, the manufactures have failed to offer a high-frequency circuit substrate that sufficiently decreases the transmission delay and transmission loss.

In view of the above circumstance, as a measure to increase the peel strength, a method can be conceived in which the dielectric layer and the metal conductor (metal base material) are bonded together through a primer or bonding adhesive. As the primer for bonding the fluororesin with the metal base material, PES, PEEK, PAI, and a mixture of these resins with fluororesin are used. The primer and bonding adhesive, however, generally have a higher specific inductive capacity than that of the dielectric layer. Consequently, the transmission velocity is decreased and the transmission delay and transmission loss may not be sufficiently decreased.

In addition, as another measure, the following method can be conceived. First, the surface of the metal base material is coarsened in advance by etching or the like. The anchoring effect of the coarsened surface is utilized to increase the peel strength.

In the metal base material, however, at high frequencies, current flows though the surface portion of the conductor due to the skin effect. In consequence, the coarsened surface elongates the propagation distance, causing the transmission delay. Furthermore, the resistance attenuation and leakage attenuation are also increased, so that the transmission loss may be increased.

To avoid the above problem, the present inventors, without coarsening the surface of the metal conductor (metal base material), brought the fluororesin into firm and intimate contact directly with the smooth metal surface. Thus, the present inventors have succeeded in obtaining a high-frequency circuit substrate that sufficiently decreases the transmission delay and transmission loss.

More specifically, the present inventors irradiated the fluororesin with ionizing radiation such as electron beams to bring the fluororesin into firm and intimate contact with the metal base material. As a result, the present inventors have succeeded in producing a high-frequency circuit substrate that has a combined specific inductive capacity of 2.6 or less and a combined dielectric loss tangent of 0.0007 or less. Furthermore, the present inventors have succeeded in obtaining a high-frequency circuit substrate that causes a transmission loss of −3 dB/m or less or even −2.5 dB/m or less at a frequency of 1 GHz. This substrate sufficiently decreases the transmission delay and transmission loss in comparison with the conventional high-frequency circuit substrate. The inventions stated in claims 1 and 2 are based on the above finding.

The invention stated in claim 1 is a high-frequency circuit substrate that has:
  (a) a metal conductor that is used for wiring and that has a surface not subjected to coarsening treatment or primer treatment; and
  (b) a dielectric layer that is made of fluororesin and that is brought into intimate contact directly with the metal conductor.

The high-frequency circuit substrate causes a transmission loss of −3 dB/m or less at a frequency of 1 GHz. In the above description, the transmission loss is defined as a transmission loss converted to the transmission characteristic when measured by using the strip line configuration, shown in FIG. 4, having a length of 1 m, an impedance of 50Ω, a copper-foil thickness of 35 microns, and a ground-to-ground distance of 0.28 mm.

The invention stated in claim 2 is the high-frequency circuit substrate as defined by claim 1, and the substrate as defined by claim 2 has a combined specific inductive capacity of 2.6 or less and a combined dielectric loss tangent of 0.0007 or less both at a frequency of 1 GHz.

In the above-described invention, without using a primer or bonding adhesive, the dielectric layer is brought into intimate contact directly with a metal conductor (metal base material) having a smooth surface, which has not undergone coarsening treatment. Consequently, the transmission delay and transmission loss can be sufficiently decreased. In addition, because the resistance attenuation and leakage attenuation are small, there exists no possibility that the transmission loss will be increased. In the above description, the expression "without using a primer" refers to that a resin layer exceeding 1 μm in thickness is not formed on the surface of the metal conductor. For example, a metal conductor whose surface is coated with a rust-preventive layer that is made of metal oxide or the like and that has a thickness of 1 μm or less can be used as the metal conductor of the present invention.

The above-described effects together with the effect of using fluororesin, which is a material having a low specific inductive capacity and a low dielectric loss tangent, have enabled the achievement of a high-frequency circuit substrate that causes a transmission loss of −3 dB/m or less at a frequency of 1 GHz and that sufficiently decreases the transmission delay and transmission loss in comparison with the conventional high-frequency circuit substrate.

In addition, the present invention can offer a high-frequency circuit substrate that causes a transmission loss of −3 dB/m or less at a frequency of 1 GHz and that has a combined specific inductive capacity of 2.6 or less and a combined dielectric loss tangent of 0.0007 or less.

As the fluororesin, one type or two types or more can be cited from among polytetra-fluoroethylene (PTFE), a tetrafluoroethylene-perfluoroalkylvinyl ether copolymer (PFA), a tetrafluoroethylene-hexafluoropropylene copolymer (FEP), and a tetrafluoroethylene-ethylene copolymer (ETFE). Of these, PTFE is most desirable because it has the lowest specific inductive capacity and the lowest dielectric loss tangent, and PFA and FEP are desirable in this order.

In addition, these fluororesins are also desirable in that they have excellent resistance to heat. Furthermore, because they have low moisture permeability, they are also desirable in regard to the fact that the impedance of the circuit substrate is less likely to be affected by the humidity and consequently remains stable.

The invention stated in claim 3 is the high-frequency circuit substrate as defined by claim 1 or 2, and in the substrate as defined by claim 3, the metal conductor is a copper foil or an aluminum foil.

As the metal conductor (metal base material), copper, aluminum, iron, nickel, alloys such as SUS steel and aluminum alloy, and a composite of these can be used. Of these, copper and aluminum have particularly high conductivity. Consequently, the use of a copper or aluminum foil as the metal conductor (metal base material) enables the offering of a high-frequency circuit substrate that decreases the transmission loss further. Of these two types of foil, a copper foil is desirable in terms of conductivity, chemical stability, and cost.

The invention stated in claim 4 is the high-frequency circuit substrate as defined by any one of claims 1 to 3, and in the substrate as defined by claim 4, the metal conductor has a surface roughness, Rz (JIS B 0601-1994), of 2.0 μm or less.

The depth of the skin decreases as the frequency increases. For example, in the case of the copper, the depth of the skin d is expressed as $d=6.60\times10^{-2}/\sqrt{f}$ and therefore is inversely proportional to the square root of the frequency. For frequencies of a GHz band or higher, the control of the surface roughness Rz (the average roughness of ten data: JIS B 0601-1994) to 2.0 μm or less can sufficiently decrease the transmission delay and transmission loss.

The invention stated in claim 5 is the high-frequency circuit substrate as defined by any one of claims 1 to 4, and in the substrate as defined by claim 5, the fluororesin is cross-linked through irradiation of ionizing radiation.

As described earlier, fluororesin has a considerably low surface energy and is non-adhesive. As a result, intimate contact with the metal base material cannot be secured sufficiently, so that high peel strength cannot be achieved. Furthermore, it cannot be said that it has sufficient wear resistance. In the invention stated in claim 5, the irradiation of ionizing radiation for crosslinking such fluororesin also forms chemical bonding between the carbon atom of the fluororesin and the metal atom of the metal base material. Consequently, without the coarsening of the surface of the metal base material, the fluororesin and the metal base material can be brought into sufficiently intimate contact with each other, so that high peel strength can be achieved. In addition, the crosslinking enables the obtaining of sufficient wear resistance.

As described above, as a method for bringing the fluororesin and the metal base material into firmly intimate contact with each other, a desirable method is to irradiate ionizing radiation such as electron beams. As the irradiation dose of the ionizing radiation, a desirable irradiation dose is the one that enables the ionizing radiation to reach the metal base material, more specifically 0.01 to 500 kGy. Despite the above description, the irradiation of ionizing radiation is not necessarily essential. The fluororesin and metal base material can also be brought into intimate contact with each other by laminating them and then by pressing the laminate at a proper temperature and pressure.

The invention stated in claim 6 is the high-frequency circuit substrate as defined by any one of claims 1 to 5, and in the substrate as defined by claim 6, the metal conductor and the fluororesin are not delaminated even after 100 times of repeated peeling operations are performed in a lattice pattern cutting test in accordance with JIS K 5400 (1998 version).

As the peel strength, a desirable strength is the one that does not allow delamination even after 100 times of repeated peeling operations are performed in a lattice pattern cutting test. For example, the peel strength can be adjusted by controlling the irradiation conditions when the fluororesin is irradiated with electron beams.

In the above description, the term "not delaminated" refers to that in the foregoing lattice pattern cutting test, the evaluation grade is 98 or more (98 means that 98 squares were not delaminated in 100 squares in the lattice pattern).

The invention stated in claim 7 is the high-frequency circuit substrate as defined by any one of claims 1 to 6, and in the substrate as defined by claim 7, the dielectric layer is formed by adding filler or cloth or both to the fluororesin.

The addition of filler or cloth can improve the characteristics, such as the decrease in linear expansion coefficient and the increase in strength, and reduce the cost.

More specifically, as the filler, the desirable types include ceramic, aramid, glass, and inorganic filler. As the cloth, the desirable types include a liquid-crystal polymer (LCP), aramid, and glass cloth.

The invention stated in claim 8 is the high-frequency circuit substrate as defined by any one of claims 1 to 7, and in the substrate as defined by claim 8, the dielectric layer has a thickness of 0.5 to 300 μm.

If the dielectric layer has an excessively thin thickness, it cannot exercise its function sufficiently. On the other hand, if excessively thick, the characteristic impedance is increased. When the thickness falls in the range of 0.5 to 300 μm, these problems are not produced, which is desirable.

The invention stated in claim 9 is the high-frequency circuit substrate as defined by any one of claims 1 to 8, and in the substrate as defined by claim 9, the metal conductor has a thickness of 1 to 2,000 μm.

If the metal conductor (metal base material) has an excessively thin thickness, it cannot secure the strength required of the base material. On the other hand, it is not necessary to increase the thickness more than necessary because it is only required to exploit the skin effect. A more desirable thickness is 10 to 300 μm.

Advantageous Effects of Invention

The present invention can offer a high-frequency circuit substrate that sufficiently decreases the transmission delay and transmission loss in comparison with the conventional high-frequency circuit substrate.

DESCRIPTION OF EMBODIMENTS

Figure 1:
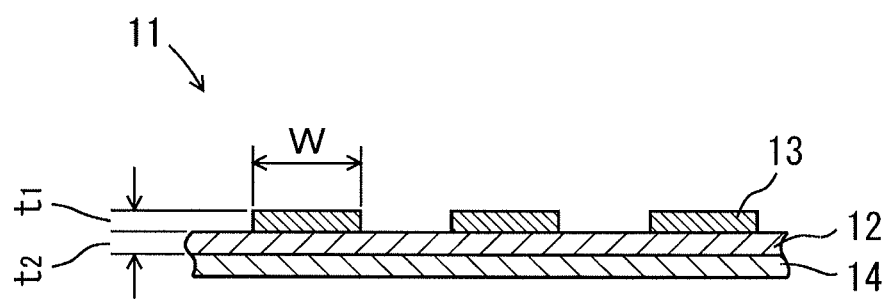
FIG. 1 is a diagram schematically showing the cross-sectional structure of the three-layer type high-frequency circuit substrate of an embodiment of the present invention.

An explanation is given below to the present invention based on its embodiments with the drawing being referred to.

1. Structure of High-Frequency Circuit Substrate

First, the structure of high-frequency circuit substrates of the present invention is explained.

(1) Three-Layer Type

FIG. 1 is a diagram schematically showing the cross-sectional structure of the three-layer type high-frequency circuit substrate of an embodiment of the present invention. In FIG. 1, "11" denotes a high-frequency circuit substrate, "12" denotes a dielectric layer, "13" denotes a conductor formed, for example, by etching the metal base material, and "14" denotes a base plate. For the base plate 14, generally, Cu is advantageously used, and in the case of a flexible circuit substrate, polyimide (PI), LCP, or desirably PTFE, which has low moisture permeability, is used. When the base plate 14 is formed without using metal (conductor) (that is, in the case of ceramic or plastic, for example), a ground layer (conductor) is provided. The line width W, the pitch, and so on are designed as appropriate according to the specification of the high-frequency circuit substrate.

(2) Multilayer Type

Figure 2:
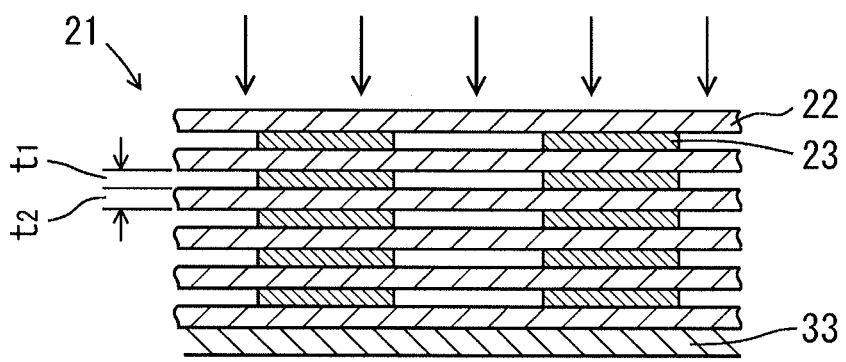
FIG. 2 is a diagram schematically showing the cross-sectional structure of the multi-layer type high-frequency circuit substrate of an embodiment of the present invention.

FIG. 2 is a diagram schematically showing the cross-sectional structure of the multi-layer type high-frequency circuit substrate of another embodiment of the present invention. In FIG. 2, "21" denotes a high-frequency circuit substrate, "22" denotes a dielectric layer, and "23" denotes a conductor formed by processing a metal base material through etching, cutting, printing, or another means. In addition, "33" denotes a ground (conductor) (Cu). Such a multilayer-structured high-frequency circuit substrate 21 can be efficiently produced, for example, by laminating a predetermined number of dielectric layers 22 whose surface is provided with conductors 23 and subsequently by irradiating the entire laminate with electron beams.

It is desirable that the thickness t1 of the conductors 13 and 23 be set at 1 to 2,000 μm, more desirably 10 to 300 mm. As described earlier, the foregoing thickness can secure the strength as the base material and utilize the skin effect at a proper thickness.

It is desirable that the thickness t2 of the dielectric layers 12 and 22 be set at 0.5 to 300 μm, more desirably 0.5 to 50 μm, preferably 5 to 30 μm. As described earlier, the foregoing thickness enables the dielectric layer to fully exercise its function and can suppress the characteristic impedance to a proper level.

2. Method of Forming Dielectric Layer

Figure 3:
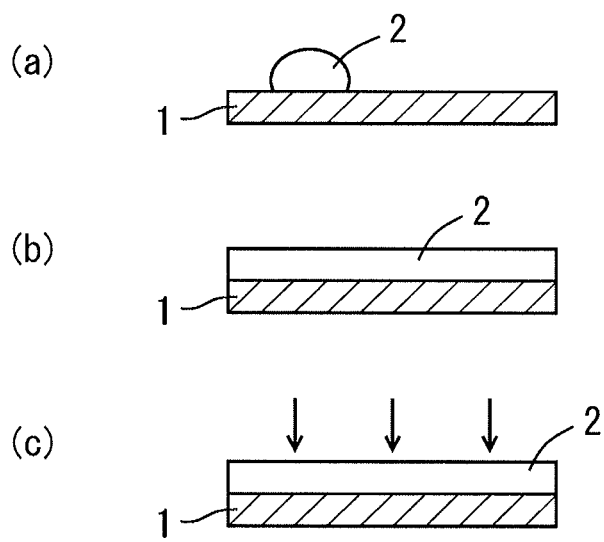
FIG. 3 is a diagram illustrating the method of forming the dielectric layer in the production of the high-frequency circuit substrate of an embodiment of the present invention.

Next, the method of forming the dielectric layer is explained. FIG. 3 is a diagram illustrating the method of forming the dielectric layer in the production of the high-frequency circuit substrate of an embodiment of the present invention. In FIG. 3, "1" denotes a metal base material (metal conductor) and "2" denotes fluororesin.

A fluororesin 2 is supplied as a dispersion. First, the fluororesin 2 is dropped onto a metal base material 1 (FIG.

3 (a)). Then, the fluororesin 2 is uniformly coated on the metal base material 1 by using the spin coating method, the casting method, or the like and subsequently dried to form a coating film of the fluororesin 2 (FIG. 3 (b)). The coating film of the fluororesin 2 formed on the metal base material 1 is irradiated with electron beams in a predetermined low-oxygen content atmosphere such as a nitrogen atmosphere to crosslink the fluororesin 2 (FIG. 3 (c)). In an alternative embodiment, a laminate formed by laminating a layer of dielectric such as thermoplastic fluororesin film and a metal base material is heated at a temperature 0° C. to 100° C. higher than the melting point of the thermoplastic fluororesin constituting the dielectric layer and is simultaneously pressed to bring the dielectric layer and the metal base material into intimate contact with each other.

EXAMPLE 1

The following example was carried out to evaluate the bonding strength.
1. Production of Test Specimen
An electrolytic copper foil CF-LB9 made by FUKUDA METAL FOIL & POWDER COMPANY, LIMITED (thickness: 20 μm; surface roughness: Rz=1.0 μm) was immersed in diluted sulfuric acid to obtain a copper foil cleared of a coating for preventing oxidation.
Subsequently, a PTFE dispersion (EK-3700) made by DAIKIN INDUSTRIES, LIMITED was coated on the copper foil by casting and then dried. The coating was baked at 360° C. in a nitrogen atmosphere (to prevent oxidation) to form a PTFE film of 15 μm on the copper foil.
The copper foil on which the PTFE film was formed was subjected to an electron-beam irradiation of 300 kGy at an irradiation temperature of 340° C. in an atmosphere having an oxygen content of 5 ppm by using an electron-beam irradiation apparatus (accelerating voltage: 1.13 MeV) made by Nissin Electric Co., Ltd. This operation simultaneously cross-linked the PTFE and bonded the copper foil and the PTFE together to obtain the test specimen of Example 1.
In addition, Comparative example 1 was performed. The test specimen of Comparative example 1 was obtained by the same method as used in Example 1 except that the electron-beam irradiation was omitted.
In this example, a copper foil having a surface roughness, Rz, of 1.0 μm was used. On the other hand, by utilizing the technique to bond PTFE with a copper foil through electron-beam irradiation, a copper foil having any surface roughness can be bonded with PTFE.
2. Evaluation of Bonding Strength
The test specimens of Example 1 and Comparative example 1 were subjected to the lattice pattern cutting test in accordance with JIS K 5400 (1998 version) (the number of tape-peeling tests: 100 times). The results are shown in Table I.

TABLE I

| Test specimen | Electron-beam irradiation | Number of remaining PTFE sections/number of sections in lattice pattern |
|---|---|---|
| Example 1 | Performed | 100/100 |
| Comparative example 1 | Not performed | 0/100 |

As shown in Table I, in the test specimen of Comparative example 1, which was not irradiated with electron beams, all PTFE sections were peeled easily at the first tape-peeling test. In contrast, in the test specimen of Example 1, which was irradiated with electron beams, no PTFE sections were peeled even at 100 times of lattice pattern cutting test. The test results reveal that sufficient peel strength can be achieved by electron-beam irradiation.

The following examples were performed to evaluate the electrical properties through the method in accordance with IPC TM650 2. 5. 5. 5.

EXAMPLE 2

Figure 4:
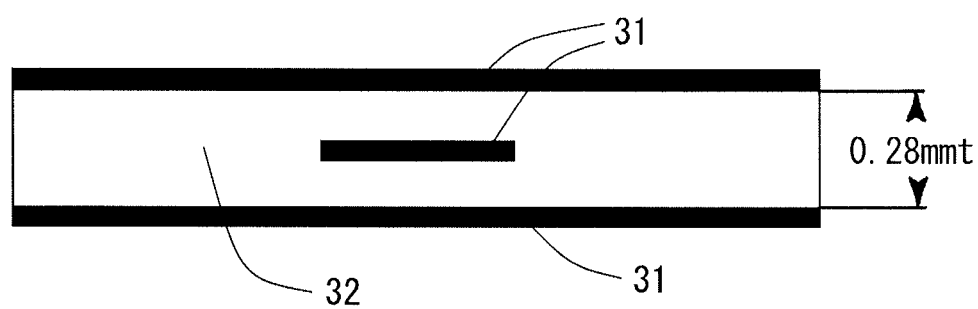
FIG. 4 is a diagram showing the structure of the test specimen to evaluate the electrical properties.

As the test specimen, a three-layer printed wiring board having a strip-line structure shown in FIG. 4. (length: 1 m; impedance: 50Ω) was produced. In FIG. 4, "31" denotes a copper foil (thickness: 35 μm) having a surface roughness, Rz, shown in Table II and "32" denotes a dielectric layer. Comparative example 2 used epoxy resin, which is a generally used dielectric. Comparative example 3 formed, as the dielectric layer, a PTFE layer on a copper foil having a coarse surface roughness, Rz, which was conventionally generally used to maintain the bondability with the PTFE layer.

EXAMPLE 3

An FEP film (Neoflon FEP NE-2, made by DAIKIN INDUSTRIES, LTD.; thickness: 35 μm; melting point: 270° C.) was sandwiched between two copper foils, which were the same foils as used in Example 1. The laminate was run between rollers heated at 320° C. at a speed of 0.5 m/min to bring the copper foil and the FEP film into intimate contact with each other. The laminate was then irradiated with electron beams at 0.1 kGy as in Example 1. As with Example 2, this test specimen was evaluated as a three-layer printed wiring board having a strip-line structure shown in FIG. 4.

The test specimens were subjected to measurement of the combined specific inductive capacity ∈r and the combined dielectric loss tangent tan δ at a frequency of 1 GHz. In addition, the transmission loss (attenuation constant) was evaluated at frequencies of 1 GHz and 10 GHz. The results are shown in Table II.

TABLE II

| Test specimen | Dielectric layer | $\epsilon_r$ | tan δ | Transmission loss (dB/m) | | Rz (μm) |
|---|---|---|---|---|---|---|
| | | | | 1 GHz | 10 GHz | |
| Comparative example 2 | Epoxy resin | 4.2 | 0.017 | −7 | −60 | — |
| Comparative example 3 | PTFE | 2.6 | 0.007 | −4 | −12 | 5 |
| Example 2 | PTFE | 2.2 | 0.0007 | −2.5 | −4 | 0.1 |
| Example 3 | FEP | 2 | 0.0005 | −2.3 | −3 | 0.1 |

Table II reveals that the formation of the dielectric layer by using PTFE and FEP can decrease the transmission loss. Furthermore, when the same PTFE is used, it becomes clear that the smoother base material having a smaller surface roughness, Rz, can further decrease the transmission loss.

In addition, in Example 2, the depth of the skin is calculated to be 4 μm at a frequency of 1 GHz and 0.7 μm at 10 GHz, which is sufficiently shallow.

In the above, the present invention is explained based on the embodiments. The present invention, however, is not limited to the above-described embodiments. The above-described embodiments can be modified variously within the scope identical or equivalent to that of the present invention.

REFERENCE SIGNS LIST

1: Metal base material (metal conductor);
2: Fluororesin;
11: Three-layer type high-frequency circuit substrate;
12, 22, 32: Dielectric layer;
13, 23: Conductor;
14: Base plate:
21: Multilayer type high-frequency circuit substrate;
31: Copper foil;
32: Dielectric layer;
33: Ground (conductor);
t1: Thickness of conductor;
t2: Thickness of dielectric layer; and
W: Line width.

The invention claimed is:

1. A high-frequency circuit substrate, comprising a metal conductor, a dielectric layer and a base plate:
   the metal conductor that is used for wiring and that has a surface not subjected to coarsening treatment or primer treatment; and
   a dielectric layer that is made of fluororesin only and that is brought into intimate contact directly with the metal conductor;
   the substrate causing a transmission loss of −3 dB/m or less at a frequency of 1 GHz,
   wherein the fluororesin consists of at least one selecting from the group consisting of polytetrafluoroethylene (PTFE), a tetrafluoroethylene-perfluoroalkylvinyl ether copolymer (PFA), and a tetrafluoroethylene-hexafluoropropylene copolymer (FEP),
   wherein chemical bonding between a carbon atom of the fluororesin and a metal atom of the metal conductor is formed,
   wherein the fluororesin is crosslinked through irradiation of ionizing radiation, and
   wherein the metal conductor has a surface roughness Rz measured by JIS B 0601-1994 of 2.0 μm or less.

2. The high-frequency circuit substrate as defined by claim 1, having a combined specific inductive capacity of 2.6 or less and a combined dielectric loss tangent of 0.0007 or less both at a frequency of 1 GHz.

3. The high-frequency circuit substrate as defined by claim 1, wherein the metal conductor is a copper foil or an aluminum foil.

4. The high-frequency circuit substrate as defined by claim 1, wherein the metal conductor and the fluororesin are not delaminated even after 100 times of repeated peeling operations are performed in a lattice pattern cutting test in accordance with the 1998 version of JIS K 5400.

5. The high-frequency circuit substrate as defined by claim 1, wherein the dielectric layer has a thickness of 0.5 to 300 μm.

6. The high-frequency circuit substrate as defined by claim 1, wherein the metal conductor has a thickness of 1 to 2,000 μm.

7. A high-frequency circuit substrate comprising a plurality of metal conductors, a plurality of dielectric layers and a ground:
   the metal conductor that is used for wiring and that has a surface not subjected to coarsening treatment or primer treatment; and
   the dielectric layer that is made of fluororesin only and that is brought into intimate contact directly with the metal conductor;
   the substrate causing a transmission loss of −3 dB/m or less at a frequency of 1 GHz,
   wherein the fluororesin consists of at least one selecting from the group consisting of polytetrafluoroethylene (PTFE), a tetrafluoroethylene-perfluoroalkylvinyl ether copolymer (PFA), and a tetrafluoroethylene-hexafluoropropylene copolymer (FEP),
   wherein chemical bonding between a carbon atom of the fluororesin and a metal atom of the metal conductor is formed,
   wherein the fluororesin is crosslinked through irradiation of ionizing radiation, and
   wherein the metal conductor has a surface roughness, Rz measured by JIS B 0601-1994 of 2.0 μm or less.

8. The high-frequency circuit substrate as defined by claim 7, having a combined specific inductive capacity of 2.6 or less and a combined dielectric loss tangent of 0.0007 or less both at a frequency of 1 GHz.

9. The high-frequency circuit substrate as defined by claim 7, wherein the metal conductor is a copper foil or an aluminum foil.

10. The high-frequency circuit substrate as defined by claim 7, wherein the metal conductor and the fluororesin are not delaminated even after 100 times of repeated peeling operations are performed in a lattice pattern cutting test in accordance with the 1998 version of JIS K 5400.

11. The high-frequency circuit substrate as defined by claim 7, wherein the dielectric layer has a thickness of 0.5 to 300 μm.

12. The high-frequency circuit substrate as defined by claim 7, wherein the metal conductor has a thickness of 1 to 2,000 μm.

* * * * *